(12) United States Patent
Zhu

(10) Patent No.: US 8,829,587 B2
(45) Date of Patent: Sep. 9, 2014

(54) FLASH MEMORY DEVICE AND MANUFACTURING METHOD OF THE SAME

(75) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 195 days.

(21) Appl. No.: 13/003,585

(22) PCT Filed: Sep. 19, 2010

(86) PCT No.: PCT/CN2010/001434
§ 371 (c)(1),
(2), (4) Date: Jan. 11, 2011

(87) PCT Pub. No.: WO2011/134127
PCT Pub. Date: Nov. 3, 2011

(65) Prior Publication Data
US 2012/0018791 A1    Jan. 26, 2012

(30) Foreign Application Priority Data

Apr. 28, 2010  (CN) .......................... 2010 1 0162280

(51) Int. Cl.
| | |
|---|---|
| *H01L 29/768* | (2006.01) |
| *H01L 21/28* | (2006.01) |
| *H01L 29/423* | (2006.01) |
| *H01L 29/66* | (2006.01) |
| *H01L 29/788* | (2006.01) |

(52) U.S. Cl.
CPC .... *H01L 21/28273* (2013.01); *H01L 29/42324* (2013.01); *H01L 29/66825* (2013.01); *H01L 29/7881* (2013.01)

USPC .................. 257/316; 257/E29.3; 257/E21.209

(58) Field of Classification Search
USPC ............................... 257/316, E29.3, E21.209
See application file for complete search history.

(56) References Cited

U.S. PATENT DOCUMENTS

| | | | |
|---|---|---|---|
| 5,801,415 | A | 9/1998 | Lee et al. |
| 7,371,639 | B2 | 5/2008 | Shin |
| 2004/0029345 | A1 | 2/2004 | Deleonibus et al. |
| 2006/0033150 | A1 | 2/2006 | Shin |

FOREIGN PATENT DOCUMENTS

| | | |
|---|---|---|
| CN | 1378271 A | 11/2002 |
| CN | 1734774 A | 2/2006 |

OTHER PUBLICATIONS

PCT International Search Report and Written Opinion dated Jan. 27, 2011, from the China Patent Office in related Chinese Patent Application No. PCT/CN2010/001434 [11pages].

Office Action issued Jul. 13, 2012, by the China State Intellectual Property Office (SIPO), in related Chinese Patent Application No. CN 2010-10162280.8, with English translation (5 pages).

*Primary Examiner* — Long Pham
(74) *Attorney, Agent, or Firm* — Osha Liang LLP

(57) ABSTRACT

A flash memory device includes a semiconductor substrate, a gate stack formed on the semiconductor substrate; a channel region below the gate stack; spacers outside the gate stack; and source/drain regions outside the channel region and in the semiconductor substrate, in which the gate stack includes a first gate dielectric layer on the channel region; a first conductive layer covering an upper surface of the first gate dielectric layer and inner walls of the spacers; a second gate dielectric layer covering a surface of the first conductive layer; and a second conductive layer covering a surface of the second gate dielectric layer. A method for manufacturing a flash memory device disclosed herein.

9 Claims, 5 Drawing Sheets

FLASH MEMORY DEVICE AND MANUFACTURING METHOD OF THE SAME

BACKGROUND OF THE INVENTION

1. Field of the Invention

The present invention relates to the field of semiconductor manufacture, and more particularly, to a flash memory device and a manufacturing method thereof.

2. Description of the Prior Art

The flash memory device is a device capable of being electrically written and erased. In the flash memory device, two capacitors connected in serial are formed by arranging dielectric layers between a control gate, a floating gate, and a substrate, such that charges can be kept on the floating gate even when the device is shut off, and thereby providing memory function.

In order to improve the switching performance of the device, it is desirable to further increase capacitance between the control gate and the floating gate, whereby concentrating voltage on the capacitor formed by the floating gate and source/drain regions.

SUMMARY OF THE INVENTION

To further increase the capacitance between the control gate and the floating gate, an aspect of the present invention provides a flash memory device, comprising: a semiconductor substrate, a gate stack formed on the semiconductor substrate; a channel region below the gate stack; spacers outside the gate stack; and source/drain regions outside the channel region, wherein the gate stack comprises: a first gate dielectric layer on the channel region; a first conductive layer covering an upper surface of the first gate dielectric layer and inner walls of the spacers; a second gate dielectric layer covering a surface of the first conductive layer; and a second conductive layer covering a surface of the second gate dielectric layer.

Another aspect of the present invention provides a method for manufacturing a flash memory device, comprises: providing a semiconductor substrate; forming a sacrificial gate stack, spacers outside the sacrificial gate stack, and source/drain regions outside the spacers on the semiconductor substrate, wherein the sacrificial gate stack comprises a first gate dielectric layer and a sacrificial gate; removing the sacrificial gate to form a first opening surrounded by inner walls of the spacers; depositing a first conductive layer, a second gate dielectric layer and a second conductive layer in this order to cover a bottom and sidewalls of the first opening, and etching them to form a gate stack.

In the method, preferably, the sacrificial gate stack further comprises an etching protection layer between the first gate dielectric layer and the sacrificial gate. The etching protection layer can be of the same material as the first conductive layer and is used for protecting the first gate dielectric layer.

In the above solutions, preferably, the first gate dielectric layer and the second gate dielectric layer can be formed of any one of $Al_2O_3$, $HfO_2$, HfSiO, HfSiON, HfTaO, HfTiO, HfZrO, $SiO_2$, and $Si_3N_4$, or a combination of some of these materials.

The first conductive layer and the second conductive layer can be formed of any one of TiN, TaN, Ti, Ta, Cu, Al, and polysilicon, or a combination of some of these materials.

According to the flash memory device provided by the embodiments of the present invention, the first conductive layer and the second gate dielectric layer are deposited in this order covering the first gate dielectric layer and the sidewalls of the spacers, such that the facing area of the capacitor between the control gate and the floating gate is greatly increased. Therefore, a bigger capacitance is obtained, resulting in a better switching performance.

BRIEF DESCRIPTION OF THE DRAWINGS

The above and other objects and advantages of the present invention will become apparent from the following description about the exemplary embodiments of the present invention. In the figures, like reference numerals indicate like parts.

DETAILED DESCRIPTION OF THE PREFERRED EMBODIMENTS

Next, the present invention will be described with reference to specific embodiments shown in the figures. However, it should be understood that the description is only exemplary and does not intend to limit the scope of the present invention. Further, in the following description, descriptions on well-known structures and technologies are omitted, in order not to obscure the concept of the present invention unnecessarily.

The figures show schematic views of the structures of layers according to embodiments of the present invention. These figures are not drawn to scale. Some details may be enlarged while some may be omitted for clarity. The shapes of various regions and layers shown in the figures and their relative sizes and positions are only exemplary, and may be varied due to manufacture tolerance or technology limitations. Those skilled in the art can design region/layer having different shapes, sizes, and relative positions, according to actual requirements.

Figure 1:
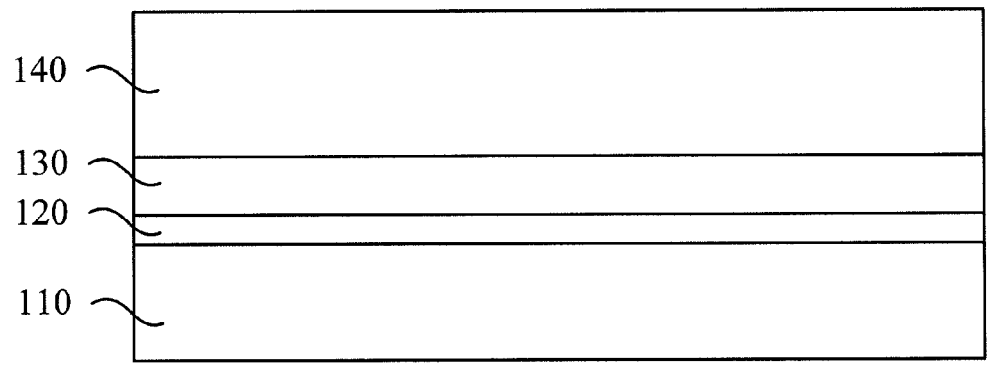
FIGS. 1-10 show sectional views of the device structure in each step of the process of manufacturing the flash memory device according to the present invention.

As shown in FIG. 1, a first gate dielectric layer 120 with a thickness of 2~5 nm is deposited on an upper surface of a semiconductor substrate 110 (e.g. a Si substrate). The first gate dielectric layer 120 can be $Al_2O_3$, $HfO_2$, HfSiO, HfSiON, HfTaO, HfTiO, HfZrO, $SiO_2$, or $Si_3N_4$, or a combination of some of these materials. The semiconductor substrate 110 has gone through some processes such as initial doping and formation of protection layers of oxide or nitride thereon. These processes are all basic processes in MOS manufacture.

An etching protection layer 130 is deposited on the first gate dielectric layer 120. The etching protection layer 130 may be formed of any one of TiN, TaN, Ti, Ta, Al, Cu, Co, Ni, and polysilicon, or a combination of some of these materials, or may include $Ta_2C$、HfN、HfC、TiC、MoN、MoC、TaTbN、TaErN、TaYbN、TaSiN、TaAlN、TiAlN、TaHfN、TiHfN、HfSiN、MoSiN、MoAlN、Mo、Ru、$RuO_2$、$RuTa_x$、$NiTa_x$, or other metals, to protect the underlying first gate dielectric layer from being damaged in the process. A polysilicon layer 140 is deposited on the etching protection layer 130 to form a sacrificial gate. The etching protection layer 130 is not necessary, and the sacrificial gate can be formed directly on the first gate dielectric layer 120.

Figure 2:
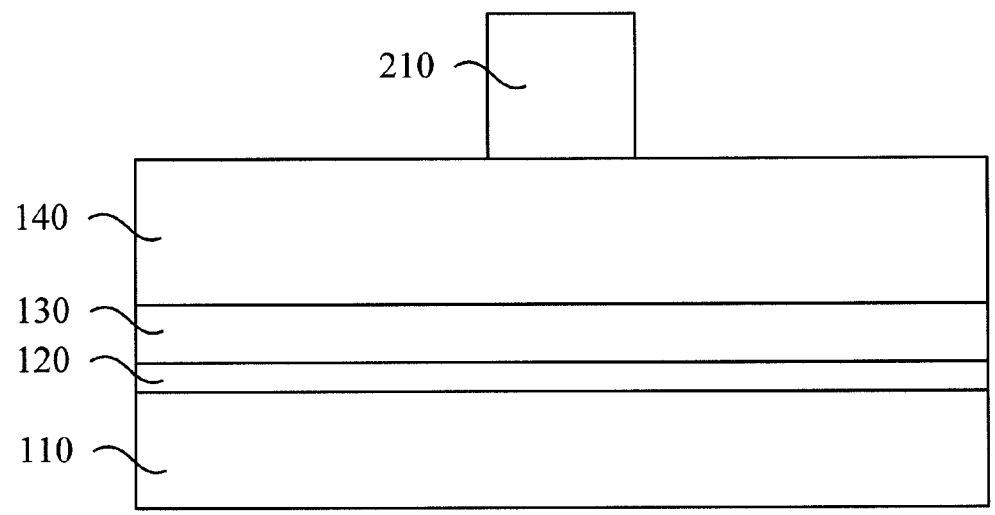

Next, as shown in FIG. 2, a photoresist layer is applied on the polysilicon layer 140, and is patterned according to a shape of the gate, so as to form a patterned photoresist layer 210.

Figure 3:
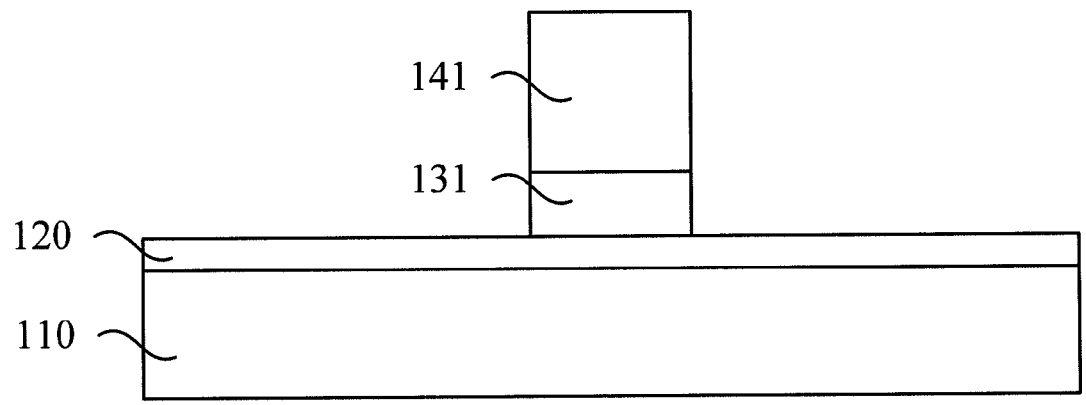

The polysilicon layer 140 and the etching protection layer 130 are etched by reactive ion etching (RIE) to form an etching protection layer 131 which has already been etched and a sacrificial gate 141, using the patterned photoresist layer 210 as a mask. Then the patterned photoresist layer 210 is removed, as shown in FIG. 3.

The etching protection layer 131 forms a part of the floating gate of the flash memory device. This part is not necessarily formed in this step. It can also be formed later when the first conductive layer is deposited.

Of course, in other embodiments of the present invention, the first gate dielectric layer 120 can also be etched in this etching step. However, in this embodiment, it is preferable that the first gate dielectric layer 120 is not etched in this step.

Figure 4:
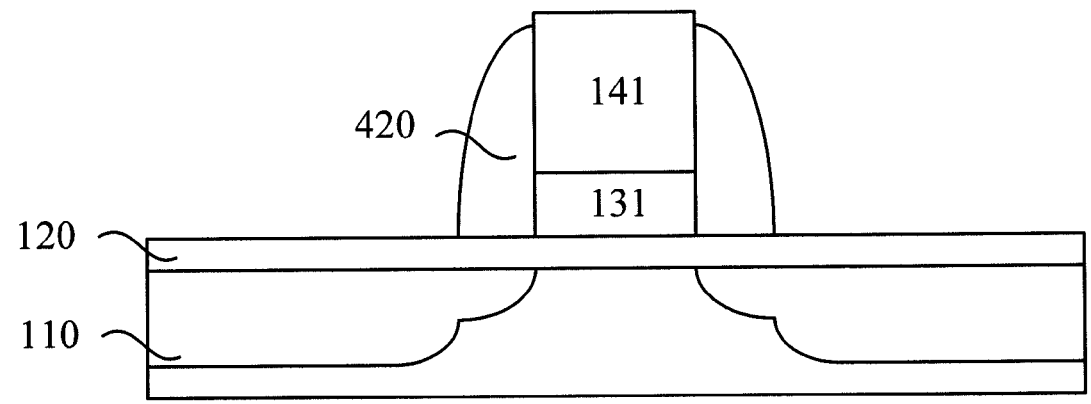
Figure 5:
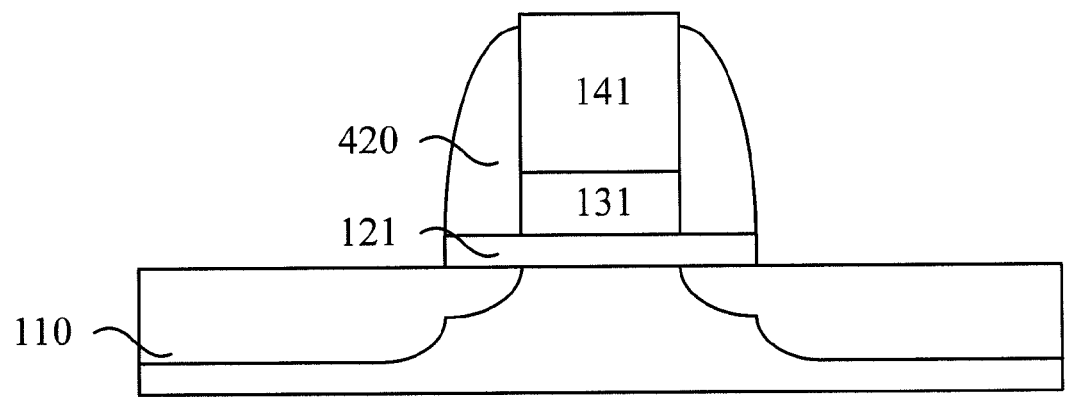

Then, as shown in FIG. 4, lightly-doped source/drain regions (or called source/drain extension regions) can be formed by low-energy ion implantation into the silicon substrate 110, using the sacrificial gate stack as a mask. A Halo region can also be formed in the silicon substrate 110 by large-angle implantation. An oxide layer or a nitride layer, such as $Si_3N_4$, is deposited on the first gate dielectric layer 120 and the sacrificial gate 141. The oxide layer or nitride layer is etched to form gate spacers 420. Then the first gate dielectric layer 120 is etched using the sacrificial gate stack with the gate spacers 420 as a mask to obtain a first gate dielectric layer 121, and a conventional ion implantation is performed to obtain the source/drain regions. Then, activation anneal is performed for about 5 seconds at about 1000° C. to activate the source/drain regions.

Next, a metal layer such as Ti, W, or Co is deposited on the source/drain regions and the sacrificial gate 141, and is processed by high-temperature anneal to form a metal silicide contact 510 on the source/drain regions and a metal silicide contact 520 on the sacrificial gate 141, whereby efficiently reducing the contact resistance of the source/drain.

A thin nitride layer can be deposited on the semiconductor substrate having part of the device structure accomplished, to further protect the source/drain region.

Figure 6:
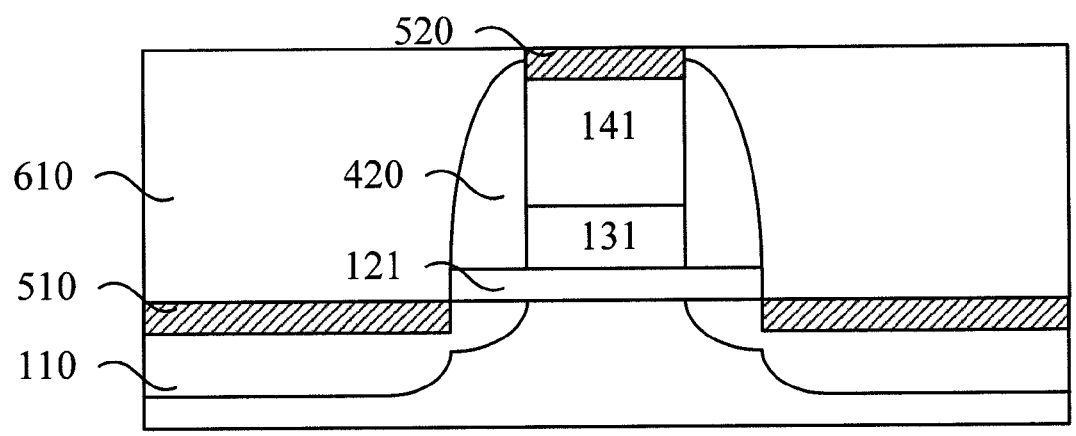

Then, as shown in FIG. 6, an interlayer dielectric layer 610, such as $SiO_2$, phospho-silicate-glass, or boro-phospho-silicate-glass, is deposited on surfaces of the semiconductor substrate and devices thereon, and is planarized by chemical mechanical polish until the metal silicide contact 520 on an upper surface of the sacrificial gate 141 is exposed.

Figure 7:
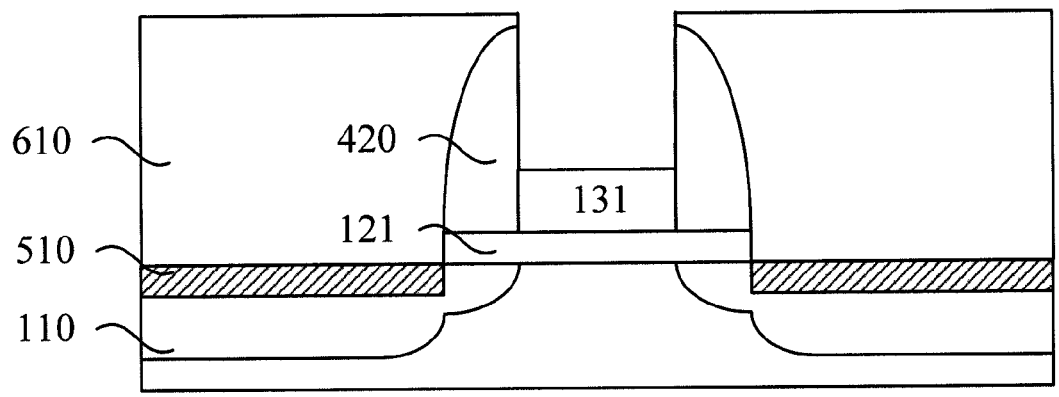

Then, as shown in FIG. 7, the sacrificial gate 141 comprising the silicide contact 520 is removed by etching, to form a first opening to expose the etching protection layer 131.

It should be noted that the process for forming the semiconductor structure comprising the source region, the drain region, the gate spacers, the gate dielectric layer, and the sacrificial gate is well known in the art. The above-described process is only an example and should not be construed as a limitation to the present invention. The above semiconductor structure can be formed by any other methods known in the art.

Figure 8:
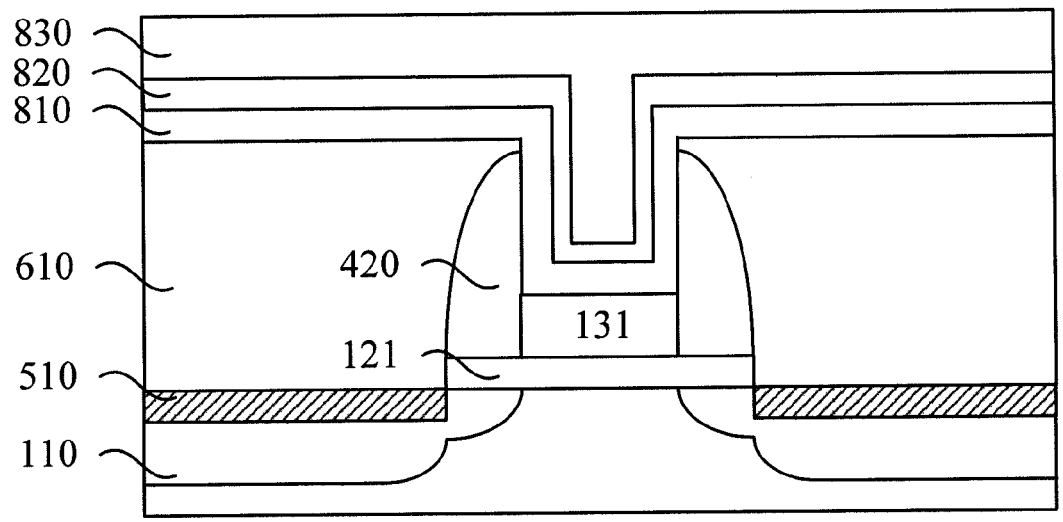
Figure 9:
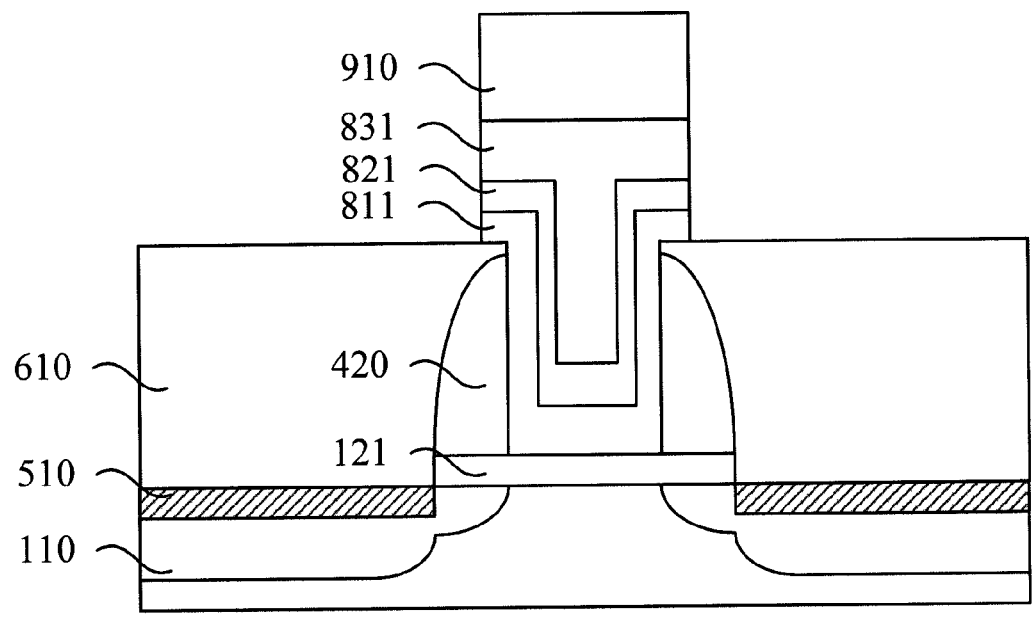
Figure 10:
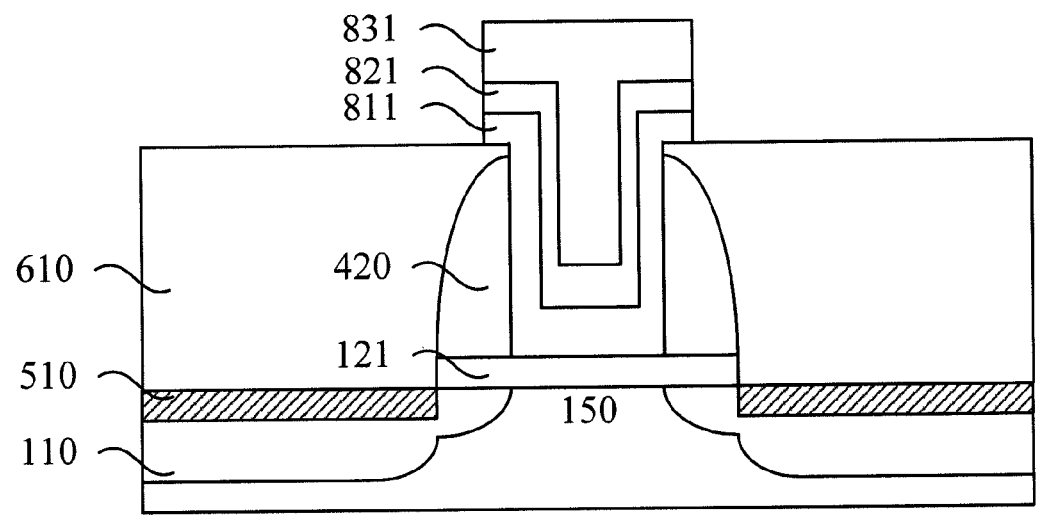

Then, as shown in FIG. 8, a first conductive layer material, which may be any one of TiN, TaN, Ti, Ta, Cu, Al, Co, Ni, and polysilicon, or a combination of some of these materials and has a preferable thickness of 5~20 nm, is deposited on the semiconductor substrate, to form a first conductive layer 810. The first conductive layer 810 forms a U-shaped opening in the first opening, which is referred to as a second opening. The etching protection layer 131 previously formed can be of the same material as the first conductive layer, and thus can be formed with the first conductive layer as a whole. Therefore the etching protection layer 131 is omitted and the whole structure is generally referred to by the first conductive layer 810 in FIG. 9. FIG. 10 is of the same case.

A second gate dielectric layer 820 is deposited on the first conductive layer 810. The second gate dielectric layer 820 can be of any one of $Al_2O_3$, $HfO_2$, HfSiO, HfSiON, HfTaO, HfTiO, HfZrO, $SiO_2$, and $Si_3N_4$, or a combination of some of these materials. It is preferable to use high-K dielectric materials and the thickness is 5~20 nm. The second gate dielectric layer 820 forms a U-shaped opening in the second opening, which is referred to as a third opening.

A second conductive layer 830 is deposited on the second gate dielectric layer 820. The second conductive layer can be of a same material as the first conductive layer, which is preferable to be TiN. The second conductive layer 830 fills the third opening.

As shown in FIG. 8, the first conductive layer 810, the second gate dielectric layer 820, and the second conductive layer 830 are preferably deposited on the whole semiconductor substrate, such that the size of the etching range can be selected when the gate stack is formed by etching in later steps.

Those skilled in the art can perform the above steps by any known proper deposition and etching process.

Then, a photoresist layer is applied on the second conductive layer 830 and patterned according to the shape of the control gate, to form a patterned photoresist layer 910. The second conductive layer 830, the second gate dielectric layer 820, and the first conductive layer 810 are etched by RIE using the patterned photoresist layer 910 as a mask, to form a control gate 831, a second gate dielectric layer 821, and a floating gate 811, as shown in FIG. 9.

It should be noted that the length of the top part of the etched gate stack is larger than the length of the first opening. This is partly to further increase the facing area of the capacitor formed between the control gate 831 and the floating gate 811, and on the other hand, a wide gate stack is advantageous in reducing the resistance of the gate and therefore improving the performance of the device.

Finally, as shown in FIG. 10, the patterned photoresist layer 910 is removed to obtain the flash memory device according to the embodiment of the present invention.

As shown in FIG. 10, the flash memory device structure according to the embodiment of the present invention thus obtained comprises:

a semiconductor substrate 110; a gate stack formed on the semiconductor substrate 110;

a channel region 150 below the gate stack; spacers 420 outside the gate stack; and source/drain regions outside the channel region 150.

The gate stack comprises: a first gate dielectric layer 121 on the channel region; a first conductive layer 811 covering an upper surface of the first gate dielectric layer 121 and inner walls of the spacers; a second gate dielectric layer 821 covering a surface of the first conductive layer 811; and a second conductive layer 831 covering a surface of the second conductive layer 821 and filling an opening formed on the second conductive layer 821.

In the above structure, the first conductive layer 811 functions as the floating gate of the flash memory device, and the second conductive layer 831 functions as the control gate of the flash memory device.

In the above structure, preferably, the source/drain regions can have a metal silicide contact 510.

Preferably, the first gate dielectric layer 121 and the second gate dielectric layer 821 can be of any one of $Al_2O_3$, $HfO_2$, HfSiO, HfSiON, HfTaO, HfTiO, HfZrO, $SiO_2$, and $Si_3N_4$, or a combination of some of these materials. Preferably, a high-K dielectric material is used to effectively ensure coupling between the control gate and the floating gate. The first conductive layer 811 and the second conductive layer 831 can be formed of any one of TiN, TaN, Ti, Ta, Al, Cu, Co, Ni, and polysilicon, or a combination of some of these materials.

Preferably, the length of the top part of the gate stack is larger than the channel length of the channel region 150. The first conductive layer extends to outsides of the spacers 420, and the length of the top part of the first conductive layer is larger than the channel length of the channel region 150. The second gate dielectric layer 821 extends to outsides of the spacers 420, and the length of the top part of the second dielectric layer 821 is larger than the channel length of the channel region 150. The second conductive layer 831 extends to outsides of the spacers 420, and its length is larger than the channel length of the channel region 150. This is partly to further increase the facing area of the capacitor formed between the control gate 831 and the floating gate 811, and on the other hand, a wide gate stack is advantageous in reducing the resistance of the gate, and thereby improving the device performance.

The flash memory device obtained according to embodiments of the present invention greatly increases the facing area between the control gate and the floating gate, as well as the capacitance of the capacitor formed by the control gate, the second gate dielectric layer, and the floating gate. Thus most of the voltage is transferred to the capacitor formed by the floating gate and the source/drain, such that the switching performance of the device is improved. Further, since the area of the gate stack is greatly increased, the resistance of the gate is reduced and the current performance of the device is improved.

The above description is only for explaining the embodiments of the present invention, but does not intend to limit the scope of the present invention. Those skilled in the art will understand that the scope of the present invention is defined by the accompanying claims. Any modifications or local substitutions that do not depart from the spirit and principle of the present invention will fall within the scope of the invention.

What is claimed is:

1. A flash memory device, comprising: a semiconductor substrate, a gate stack formed on the semiconductor substrate; a channel region below the gate stack; spacers outside the gate stack; and source/drain regions outside the channel region and in the semiconductor substrate, wherein the gate stack comprises:
   a first gate dielectric layer on the channel region;
   a first conductive layer covering an upper surface of the first gate dielectric layer and inner walls of the spacers;
   a second gate dielectric layer covering a surface of the first conductive layer; and
   a second conductive layer covering a surface of the second conductive gate dielectric layer,
      wherein the first conductive layer, the second gate dielectric layer, and the second conductive layer are patterned to form a top part of the gate stack above said spacers such that a cross section of the second conductive layer has a T-shaped profile, wherein a length of the top portion of the T-shaped profile is smaller than a distance between outer walls of the spacers.

2. The flash memory device according to claim 1, wherein the first gate dielectric layer is formed of any one of $Al_2O_3$, $HfO_2$, HfSiO, HfSiON, HfTaO, HfTiO, HfZrO, $SiO_2$, and $Si_3N_4$, or a combination of some of these materials.

3. The flash memory device according to claim 1, wherein the second gate dielectric layer is formed of any one of $Al_2O_3$, $HfO_2$, HfSiO, HfSiON, HfTaO, HfTiO, HfZrO, $SiO_2$, and $Si_3N_4$, or a combination of some of these materials.

4. The flash memory device according to claim 1, wherein first conductive layer is formed of any one of TiN, TaN, Ti, Ta, Al, Cu, Co, Ni, and polysilicon, or a combination of some of these materials.

5. The flash memory device according to claim 1, wherein second conductive layer is formed of any one of TiN, TaN, Ti, Ta, Al, Cu, Co, Ni, and polysilicon, or a combination of some of these materials.

6. The flash memory device according to claim 1, wherein the length of the top part of the second gate dielectric layer above said spacers is larger than the length of the channel.

7. The flash memory device according to claim 6, wherein the length of the top part of the second conductive layer above said spacers is larger than the length of the channel.

8. The flash memory device according to claim 1, wherein the first conductive layer, the second gate dielectric layer, and the second conductive layer have a same length of the top part above said spacers, which is larger than the length of the channel.

9. The flash memory device according to claim 2, wherein the first conductive layer, the second gate dielectric layer, and the second conductive layer have a same length of the top part above said spacers, which is larger than the length of the channel.

* * * * *